United States Patent
Ma (10) Patent No.: US 10,043,586 B2
(45) Date of Patent: Aug. 7, 2018

(54) SHIFT REGISTER AND METHOD FOR DRIVING THE SAME, DRIVING CIRCUIT AND DISPLAY DEVICE

(71) Applicant: BOE TECHNOLOGY GROUP CO., LTD., Beijing (CN)

(72) Inventor: Zhanjie Ma, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 15/206,391

(22) Filed: Jul. 11, 2016

(65) Prior Publication Data
US 2017/0287393 A1    Oct. 5, 2017

(30) Foreign Application Priority Data

Mar. 30, 2016  (CN) .......................... 2016 1 0191328

(51) Int. Cl.
G09G 3/3225    (2016.01)
G11C 19/28     (2006.01)
G09G 3/3266    (2016.01)

(52) U.S. Cl.
CPC ........... *G11C 19/28* (2013.01); *G09G 3/3266* (2013.01); *G09G 2310/0286* (2013.01)

(58) Field of Classification Search
CPC ......... G09G 3/3266; G09G 2310/0286; G09G 3/3225; G11C 19/28; G11C 19/287

USPC .............. 345/87, 92, 98, 99, 100, 205, 206; 327/108
See application file for complete search history.

(56) References Cited

U.S. PATENT DOCUMENTS

| | | | |
|---|---|---|---|
| 7,656,194 B2* | 2/2010 | Shin ...................... | G11C 19/00 326/46 |
| 2012/0038609 A1* | 2/2012 | Chung .................. | G09G 3/003 345/211 |

* cited by examiner

*Primary Examiner* — Stacy Khoo
(74) *Attorney, Agent, or Firm* — Nath, Goldberg & Meyer; Joshua B. Goldberg (57) ABSTRACT

A shift register includes a pulling-up unit, a pulling-down unit and an output unit, the pulling-up unit being connected to a first input terminal, a first clock signal terminal, a first level terminal, a pulling-down node and a pulling-up node, respectively, the pulling-down unit being connected to a second input terminal, a second level terminal, the first level terminal, the pulling-up node and the pulling-down node, respectively, and the output unit being connected to the first level terminal, a second clock signal terminal, an output terminal, the pulling-down node and the pulling-up node, respectively. The shift register provides an output signal through the output terminal according to the signals inputted from the first input terminal, the second input terminal, the first level terminal, the second level terminal, the first clock signal terminal and the second clock signal terminal.

12 Claims, 3 Drawing Sheets

SHIFT REGISTER AND METHOD FOR DRIVING THE SAME, DRIVING CIRCUIT AND DISPLAY DEVICE

FIELD OF THE INVENTION

The present invention relates to the field of display technology, and specifically relates to a shift register and a method for driving the same, a driving circuit and a display device.

BACKGROUND OF THE INVENTION

With continuous development of active-matrix organic light emitting diode (AMOLED) technology, a technique of adjusting brightness of an AMOLED by controlling the duty cycle of a light-emitting driving pulse has been well-developed. In a technical solution of integrating a light-emitting control shift register into a scan control shift register in the prior art, the number of clock signals is increased to realize functions of adjusting the duty cycle of the light-emitting driving pulse and driving gate lines in a scan manner jointly, resulting in reduced driving efficiency and increased product cost.

SUMMARY OF THE INVENTION

To achieve the above objects, the present invention provides a shift register and a method for driving the same, a driving circuit and a display device, which are used for solving the problem of the increased number of clock signals due to the structure in which the light-emitting control shift register is integrated with the scan control shift register in the prior art.

To this end, the present invention provides a shift register, comprising:

a pulling-up unit, which is connected to a first input terminal, a first clock signal terminal, a first level terminal, a pulling-down node and a pulling-up node, respectively, and is configured to control a voltage level at the pulling-up node according to a voltage level at the pulling-down node and signals inputted from the first input terminal, the first level terminal and the first clock signal terminal;

a pulling-down unit, which is connected to a second input terminal, a second level terminal, the first level terminal, the pulling-down node and the pulling-up node, respectively, and is configured to control the voltage level at the pulling-down node according to the voltage level at the pulling-up node and signals inputted from the second input terminal, the second level terminal and the first level terminal; and an output unit, which is connected to the first level terminal, a second clock signal terminal, an output terminal, the pulling-down node and the pulling-up node, respectively, and is configured to provide an output signal through the output terminal according to the voltage levels of the pulling-down node and the pulling-up node and signals inputted from the first level terminal and the second clock signal terminal.

Optionally, the output unit includes:

a first output module, which is connected to the first level terminal, the output terminal and the pulling-down node, respectively, and is configured to control the output signal outputted from the output terminal according to the signal inputted from the first level terminal and the voltage level at the pulling-up node; and a second output module, which is connected to the second clock signal terminal, the output terminal and the pulling-up node, respectively, and is configured to control the output signal outputted from the output terminal according to the signal inputted from the second clock signal terminal and the voltage level at the pulling-up node.

Optionally, the pulling-up unit includes a second transistor and a sixth transistor;

a gate electrode of the second transistor is connected to the pulling-down node, a first electrode of the second transistor is connected to the first level terminal, and a second electrode of the second transistor is connected to the pulling-up node; and a gate electrode of the sixth transistor is connected to the first clock signal terminal, a first electrode of the sixth transistor is connected to the first input terminal, and a second electrode of the sixth transistor is connected to the pulling-up node.

Optionally, the pulling-down unit includes a first transistor and a fifth transistor;

a gate electrode of the first transistor is connected to the pulling-up node, a first electrode of the first transistor is connected to the first level terminal, and a second electrode of the first transistor is connected to the pulling-down node; and a gate electrode of the fifth transistor is connected to the second input terminal, a first electrode of the fifth transistor is connected to the second level terminal, and a second electrode of the fifth transistor is connected to the pulling-down node.

Optionally, the first output module includes a third transistor and a first capacitor;

a gate electrode of the third transistor is connected to the pulling-down node, a first electrode of the third transistor is connected to the first level terminal, and a second electrode of the third transistor is connected to the output terminal; and a first end of the first capacitor is connected to the pulling-down node, and a second end of the first capacitor is connected to the first level terminal.

Optionally, the second output module includes a fourth transistor and a second capacitor;

a gate electrode of the fourth transistor is connected to the pulling-up node, a first electrode of the fourth transistor is connected to the output terminal, and a second electrode of the fourth transistor is connected to the second clock signal terminal; and a first end of the second capacitor is connected to the pulling-up node, and a second end of the second capacitor is connected to the output terminal.

The present invention further provides a method for driving a shift register, the shift register including the above shift register, the first level terminal providing a high level, the second level terminal providing a low level, the method comprising steps of:

in a first stage, inputting a high-level signal from the first input terminal, inputting a low-level signal from the second input terminal, inputting a low-level signal from the first clock signal terminal, and inputting a high-level signal from the second clock signal terminal, such that the pulling-up node is driven to a high level by the pulling-up unit, the pulling-down node is driven to a low level by the pulling-down unit, and the output unit outputs a high-level signal from the output terminal of the shift register;

in a second stage, inputting a high-level signal from the first input terminal, inputting a low-level signal from the second input terminal, inputting a high-level signal from the first clock signal terminal, and inputting a low-level signal from the second clock signal terminal, such that the pulling-up node is driven to a high level by the pulling-up unit, the pulling-down node is driven to a low level by the pulling-down unit, and the output unit outputs a high-level signal from the output terminal of the shift register;

in a third stage, inputting a low-level signal from the first input terminal, inputting a high-level signal from the second input terminal, inputting a low-level signal from the first clock signal terminal, and inputting a high-level signal from the second clock signal terminal, such that the pulling-up node is driven to a low level by the pulling-up unit, the pulling-down node is driven to a high level by the pulling-down unit, and the output unit outputs a high-level signal from the output terminal of the shift register;

in a fourth stage, inputting a high-level signal from the first input terminal, inputting a high-level signal from the second input terminal, inputting a high-level signal from the first clock signal terminal, and inputting a low-level signal from the second clock signal terminal, such that the pulling-up node is driven to a low level by the pulling-up unit, the pulling-down node is driven to a high level by the pulling-down unit, and the output unit outputs a low-level signal from the output terminal of the shift register;

in a fifth stage, inputting a high-level signal from the first input terminal, inputting a low-level signal from the second input terminal, inputting a low-level signal from the first clock signal terminal, and inputting a high-level signal from the second clock signal terminal, such that the pulling-up node is driven to a high level by the pulling-up unit, the pulling-down node is driven to a low level by the pulling-down unit, and the output unit outputs a high-level signal from the output terminal of the shift register; and in a sixth stage, inputting a high-level signal from the first input terminal, inputting a low-level signal from the second input terminal, inputting a high-level signal from the first clock signal terminal, and inputting a low-level signal from the second clock signal terminal, such that the pulling-up node is driven to a high level by the pulling-up unit, the pulling-down node is driven to a low level by the pulling-down unit, and the output unit outputs a high-level signal from the output terminal of the shift register.

Optionally, the method further comprises steps of:

in a seventh stage, inputting a high-level signal from the first input terminal, inputting a high-level signal from the second input terminal, inputting a low-level signal from the first clock signal terminal, and inputting a high-level signal from the second clock signal terminal, such that the pulling-up node is driven to a high level by the pulling-up unit, the pulling-down node is driven to a low level by the pulling-down unit, and the output unit outputs a high-level signal from the output terminal of the shift register; and in an eighth stage, inputting a high-level signal from the first input terminal, inputting a high-level signal from the second input terminal, inputting a high-level signal from the first clock signal terminal, and inputting a low-level signal from the second clock signal terminal, such that the pulling-up node is driven to a high level by the pulling-up unit, the pulling-down node is driven to a low level by the pulling-down unit, and the output unit outputs a high-level signal from the output terminal of the shift register, wherein the seventh stage follows the sixth stage, and starts at a time when the signal inputted from the second input terminal jumps from the low level to the high level.

Optionally, the method further comprises a step of:

repeatedly performing, a first predetermined times, the steps for the fifth and sixth stages, before performing the step for the seventh stage and after sequentially performing the steps for the fourth, fifth and sixth stages.

Optionally, the method further comprises a step of:

after performing the step for the eighth stage for the first time, repeatedly performing, a second predetermined times, a process of sequentially performing the steps for the fifth, sixth, seventh and eighth stages once for each stage.

The present invention further provides a driving circuit including the above shift register.

The present invention further provides a display device including the above driving circuit.

The beneficial effects of the present invention are as follows.

In the shift register, the method for driving the same, the driving circuit and the display device provided by the present invention, the shift register includes a pulling-up unit, a pulling-down unit and an output unit, the pulling-up unit being connected to the first input terminal, the first clock signal terminal, the first level terminal, the pulling-down node and the pulling-up node, respectively, the pulling-down unit being connected to the second input terminal, the second level terminal, the first level terminal, the pulling-down node and the pulling-up node, respectively, and the output unit being connected to the first level terminal, the second clock signal terminal, the output terminal, the pulling-down node and the pulling-up node, respectively. The shift register provided by the embodiments of the present invention may serve as the scan control shift register for providing a gate-line scan signal, which may be integrated with the light-emitting control shift register in the prior art to realize the control of an organic light-emitting diode (OLED). Compared to the solution of integrating the light-emitting control shift register into the scan control shift register in the prior art, the scan control shift register provided by the embodiments of the present invention can share a set of clock signals with the light-emitting control shift register in the prior art when they are integrated with each other, such that the number of clock signals is reduced to half of the number of clock signals in the existing technical solution. Therefore, the shift register provided by the present invention provides the output signal through the output terminal according to the signals inputted from the first input terminal, the second input terminal, the first level terminal, the second level terminal, the first clock signal terminal and the second clock signal terminal, and the required number of clock signals is decreased when the shift register is integrated with the light-emitting control shift register, thereby improving driving efficiency and reducing product cost.

DETAILED DESCRIPTION OF THE EMBODIMENTS

To make those skilled in the art better understand the technical solutions of the present invention, a shift register and a method for driving the same, a driving circuit and a display device provided by the present invention will be described in detail below in conjunction with the accompanying drawings.

First Embodiment

Figure 1:
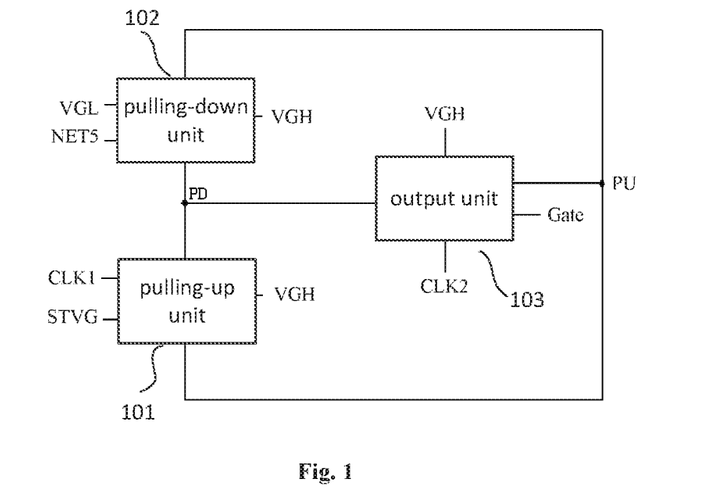
FIG. 1 is a structural schematic diagram of a shift register according to a first embodiment of the present invention.

FIG. 1 is a structural schematic diagram of a shift register according to the first embodiment of the present invention. As illustrated in FIG. 1, the shift register includes a pulling-up unit 101, a pulling-down unit 102 and an output unit 103. The pulling-up unit 101 is connected to a first input terminal STVG, a first clock signal terminal CLK1, a first level terminal VGH, a pulling-down node PD and a pulling-up node PU, respectively, the pulling-down unit 102 is connected to a second input terminal NET5, a second level terminal VGL, the first level terminal VGH, the pulling-up node PU and the pulling-down node PD, respectively, and the output unit 103 is connected to the first level terminal VGH, a second clock signal terminal CLK2, an output terminal Gate, the pulling-down node PD and the pulling-up node PU, respectively.

In this embodiment, the pulling-up unit 101 controls a voltage level at the pulling-up node PU according to the voltage level at the pulling-down node PD and signals inputted from the first input terminal STVG, the first level terminal VGH and the first clock signal terminal CLK1, the pulling-down unit 102 controls a voltage level at the pulling-down node PD according to the voltage level at the pulling-up node PU and signals inputted from the second input terminal NET5, the first level terminal VGH and the second level terminal VGL, and the output unit 103 provides an output signal through the output terminal Gate according to the voltage levels of the pulling-down node PD and the pulling-up node PU and signals inputted from the first level terminal VGH and the second clock signal terminal CLK2. The shift register provided by this embodiment may serve as a scan control shift register for providing a gate-line scan signal, which may be integrated with the light-emitting control shift register in the prior art to realize the control of an OLED, the integrated manner including, but not limited to, employing a signal of an intermediate node of the light-emitting control shift register in the prior art as the signal inputted from the second input terminal NET5 of the shift register provided by this embodiment. Compared to the solution of integrating the light-emitting control shift register into the scan control shift register in the prior art, the scan control shift register provided by this embodiment can share a set of clock signals (that is, a first clock signal inputted from the first clock signal terminal CLK1 and a second clock signal inputted from the second clock signal terminal CLK2) with the light-emitting control shift register in the prior art, such that the number of clock signals is reduced to half of the number of clock signals in the existing technical solution. Therefore, the shift register provided by this embodiment provides the output signal through the output terminal Gate according to the signals inputted from the first input terminal STVG, the second input terminal NET5, the first level terminal VGH, the second level terminal VGL, the first clock signal terminal CLK1 and the second clock signal terminal CLK2, and the required number of clock signals is decreased when the shift register is integrated with the light-emitting control shift register, thereby improving driving efficiency and reducing product cost.

Figure 2:
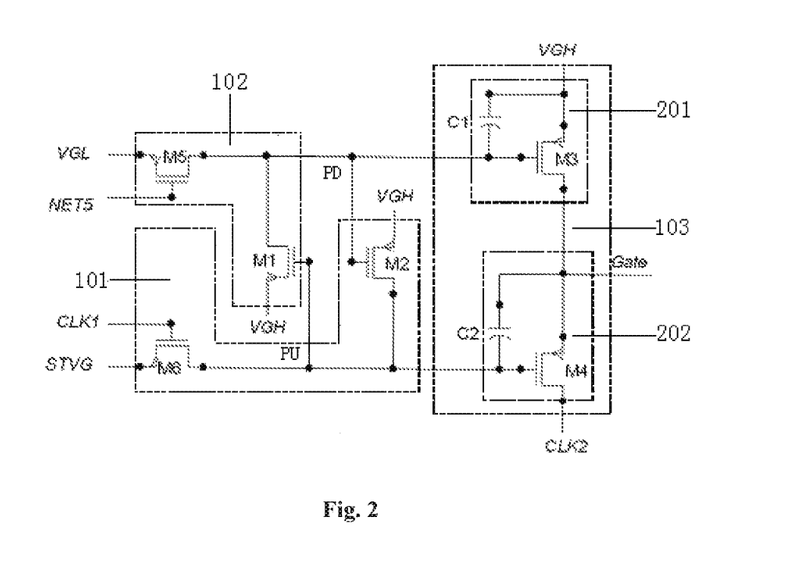
FIG. 2 is a detailed structural schematic diagram of the shift register shown in FIG. 1.

FIG. 2 is a detailed structural schematic diagram of the shift register shown in FIG. 1. As illustrated in FIG. 2, the output unit 103 includes a first output module 201 and a second output module 202. The first output module 201 is connected to the first level terminal VGH, the output terminal Gate and the pulling-down node PD, respectively, and the second output module 202 is connected to the second clock signal terminal CLK2, the output terminal Gate and the pulling-up node PU, respectively. The first output module 201 controls the output signal outputted from the output terminal Gate according to the signal inputted from the first level terminal VGH and the voltage level at the pulling-down node PD, and the second output module 202 provides the output signal outputted from the output terminal Gate according to the signal inputted from the second clock signal terminal CLK2 and the voltage level at the pulling-up node PU.

Referring to FIG. 2, the pulling-up unit 101 includes a second transistor M2 and a sixth transistor M6. A gate electrode of the second transistor M2 is connected to the pulling-down node PD, a first electrode of the second transistor M2 is connected to the first level terminal VGH, and a second electrode of the second transistor M2 is connected to the pulling-up node PU. A gate electrode of the sixth transistor M6 is connected to the first clock signal terminal CLK1, a first electrode of the sixth transistor M6 is connected to the first input terminal STVG, and a second electrode of the sixth transistor M6 is connected to the pulling-up node PU.

Referring to FIG. 2, the pulling-down unit 102 includes a first transistor M1 and a fifth transistor M5. A gate electrode of the first transistor M1 is connected to the pulling-up node PU, a first electrode of the first transistor M1 is connected to the first level terminal VGH, and a second electrode of the first transistor M1 is connected to the pulling-down node PD. A gate electrode of the fifth transistor M5 is connected to the second input terminal NET5, a first electrode of the fifth transistor M5 is connected to the second level terminal VGL, and a second electrode of the fifth transistor M5 is connected to the pulling-down node PD.

Referring to FIG. 2, the first output module 201 includes a third transistor M3 and a first capacitor C1. A gate electrode of the third transistor M3 is connected to the pulling-down node PD, a first electrode of the third transistor M3 is connected to the first level terminal VGH, and a second electrode of the third transistor M3 is connected to the output terminal Gate. A first end of the first capacitor C1 is connected to the pulling-down node PD, and a second end of the first capacitor C1 is connected to the first level terminal VGH.

Referring to FIG. 2, the second output module 202 includes a fourth transistor M4 and a second capacitor C2. A gate electrode of the fourth transistor M4 is connected to the pulling-up node PU, a first electrode of the fourth transistor M4 is connected to the output terminal Gate, and a second electrode of the fourth transistor M4 is connected to the second clock signal terminal CLK2. A first end of the second capacitor C2 is connected to the pulling-up node PU, and a second end of the second capacitor C2 is connected to the output terminal Gate.

The shift register provided by this embodiment includes the pulling-up unit, the pulling-down unit and the output unit, the pulling-up unit being connected to the first input terminal, the first clock signal terminal, the first level terminal, the pulling-down node and the pulling-up node, respectively, the pulling-down unit being connected to the second input terminal, the second level terminal, the first level terminal, the pulling-up node and the pulling-down node, respectively, and the output unit being connected to the first level terminal, the second clock signal terminal, the output terminal, the pulling-down node and the pulling-up node. The shift register provided by this embodiment provides the output signal through the output terminal according to the signals inputted from the first input terminal, the second input terminal, the first level terminal, the second level terminal, the first clock signal terminal and the second clock signal terminal, and the number of clock signals is decreased, thereby improving driving efficiency and reducing product cost.

Second Embodiment

Figure 3:
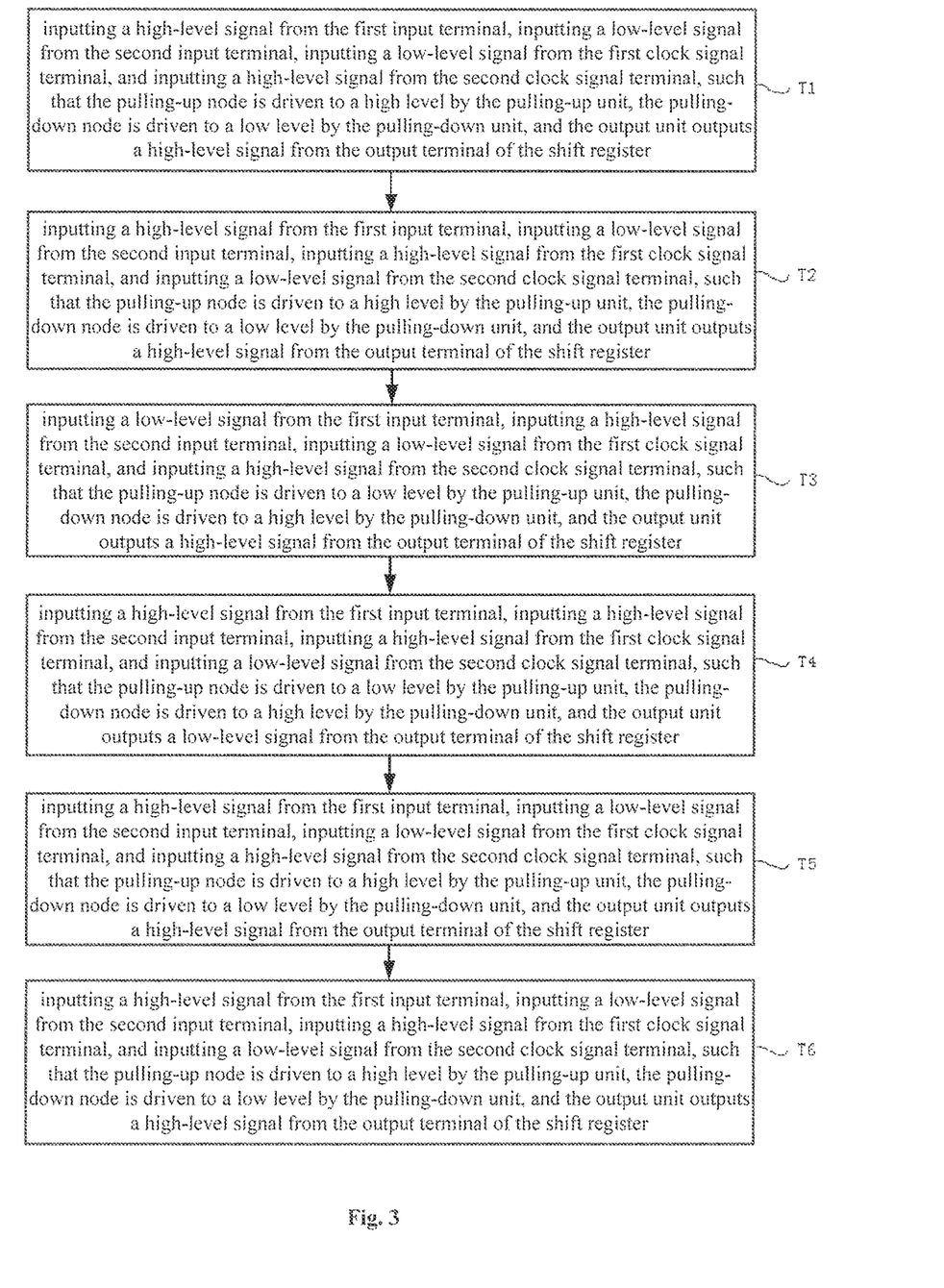
FIG. 3 is a flow chart of a method for driving a shift register according to a second embodiment of the present invention.

FIG. 3 is a flow chart of a method for driving a shift register according to the second embodiment of the present invention. As shown in FIG. 3, the shift register includes a shift register provided by the first embodiment, and its detailed structure refers to the description in the first embodiment and is omitted herein. It needs to be set forth that the process for driving the shift register is described by taking transistors of the shift register being P-type transistors as an example in this embodiment, but the present embodiment is not limited thereto and includes the case where transistors of the shift register are N-type transistors.

In this embodiment, the first-level signal provided through the first level terminal VGH is at a high level, the second-level signal provided through the second level terminal VGL is at a low level, and the driving method includes the following first to sixth stages T1 to T6.

In the first stage T1, a high-level signal is inputted from the first input terminal, a low-level signal is inputted from the second input terminal, a low-level signal is inputted from the first clock signal terminal, and a high-level signal is inputted from the second clock signal terminal, such that the pulling-up node is driven to a high level by the pulling-up unit, the pulling-down node is driven to a low level by the pulling-down unit, and the output unit outputs a high-level signal from the output terminal of the shift register.

Figure 4:
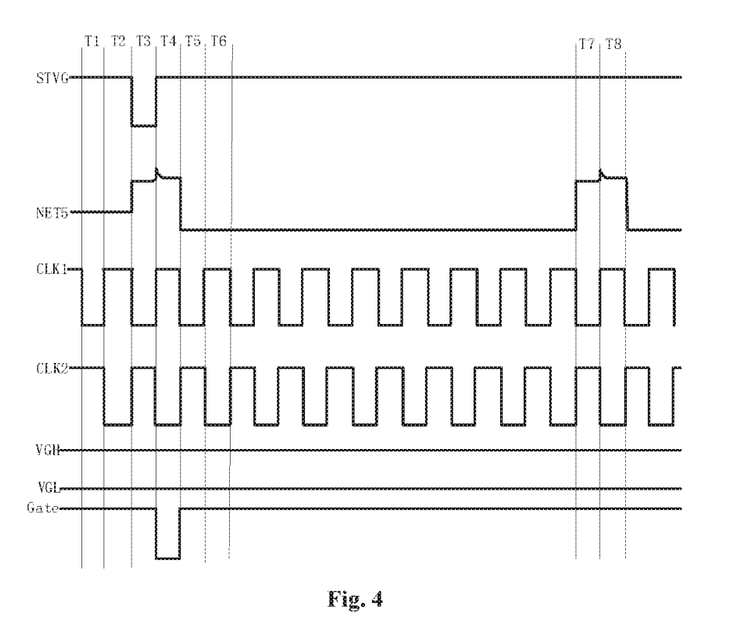
FIG. 4 is a timing diagram of the method for driving the shift register according to the second embodiment of the present invention.

In this embodiment, in the first stage T1, the signals inputted from the first input terminal STVG and the second clock signal terminal CLK2 are at a high level, and the signals inputted from the second input terminal NET5 and the first clock signal terminal CLK1 are at a low level. At this time, the fifth and sixth transistors M5 and M6 are turned on under control of the second input terminal NET5 and the first clock signal terminal CLK1. The low-level signal of the second level terminal VGL is transmitted to the first end of the first capacitor C1 via the fifth transistor M5, that is, the voltage level at the pulling-down node PD is a low level, so the third transistor M3 is turned on, and the high-level signal of the first level terminal VGH is transmitted to the output terminal Gate via the third transistor M3, such that a high-level signal is outputted through the output terminal Gate. Meanwhile, the second transistor M2 is turned on, and the high-level signal of the first level terminal VGH is transmitted to the first end of the second capacitor C2 via the second transistor M2, that is, the voltage level at the pulling-up node PU is a high level, so the fourth and first transistors M4 and M1 remain off. The high-level signal inputted from the first input terminal STVG is transmitted to the first end of the second capacitor C2 via the sixth transistor M6, which further ensures the fourth and first transistors M4 and M1 to be turned off.

In the second stage T2, a high-level signal is inputted from the first input terminal, a low-level signal is inputted from the second input terminal, a high-level signal is from the first clock signal terminal, and a low-level signal is inputted from the second clock signal terminal, such that the pulling-up node is driven to a high level by the pulling-up unit, the pulling-down node is driven to a low level by the pulling-down unit, and the output unit outputs a high-level signal from the output terminal of the shift register.

In this embodiment, in the second stage T2, the signals inputted from the first input terminal STVG and the first clock signal terminal CLK1 are at a high level, and the signals inputted from the second input terminal NET5 and the second clock signal terminal CLK2 are at a low level. At this time, the fifth transistor M5 is turned on under control of the second input terminal NET5, the low-level signal of the second level terminal VGL is constantly transmitted to the first end of the first capacitor C1 via the fifth transistor M5 (that is, the voltage level at the pulling-down node PD is a low level) so as to keep the second and third transistors M2 and M3 on, and the high-level signal of the first level terminal VGH is transmitted to the output terminal Gate via the third transistor M3, such that the high-level signal is outputted through the output terminal Gate. The high-level signal of the first level terminal VGH is constantly transmitted to the first end of the second capacitor C2 via the second transistor M2 (that is, the voltage level at the pulling-up node PU is a high level), so voltage levels at the gate electrodes of the first and fourth transistors M1 and M4 remain at a high level to ensure the first and fourth transistors M1 and M4 to be turned off.

In the third stage T3, a low-level signal is inputted from the first input terminal, a high-level signal is inputted from the second input terminal, a low-level signal is inputted from the first clock signal terminal, and a high-level signal is inputted from the second clock signal terminal, such that the pulling-up node is driven to a low level by the pulling-up unit, the pulling-down node is driven to a high level by the pulling-down unit, and the output unit outputs a high-level signal from the output terminal of the shift register.

In this embodiment, in the third stage T3, the signals inputted from the first input terminal STVG and the first clock signal terminal CLK1 are at a low level, and the signals inputted from the second input terminal NET5 and the second clock signal terminal CLK2 are at a high level. The sixth transistor M6 is turned on under control of the first clock signal terminal CLK1, and the low-level signal inputted from the first input terminal STVG is transmitted to the first end of the second capacitor C2 via the sixth transistor M6, so the first and fourth transistors M1 and M4 are turned on. A high-level signal inputted from the second clock signal terminal CLK2 is transmitted to the output terminal Gate via the fourth transistor M4, such that the high-level signal is outputted through the output terminal Gate. The high-level signal of the first level terminal VGH is transmitted to the first end of the first capacitor C1 via the first transistor M1 so as to ensure the second and third transistors M2 and M3 to be turned off. At this time, the signal of the second input terminal NET5 is at a high level, such that the fifth transistor M5 is turned off, so as to avoid affecting the voltage level at the first end of the first capacitor C1 by the low-level signal of the second level terminal VGL.

In the fourth stage T4, a high-level signal is inputted from the first input terminal, a high-level signal is inputted from the second input terminal, a high-level signal is inputted from the first clock signal terminal, and a low-level signal is inputted from the second clock signal terminal, such that the pulling-up node is driven to a low level by the pulling-up unit, the pulling-down node is driven to a high level by the pulling-down unit, and the output unit outputs a low-level signal from the output terminal of the shift register.

In this embodiment, in the fourth stage T4, the signals inputted from the first input terminal STVG, the first clock signal terminal CLK1 and the second input terminal NET5 are at a high level, and the signal inputted from the second clock terminal CLK2 is at a low level. At this time, the high-level signal inputted from the second input terminal NET5 allows the fifth transistor M5 to be turned off, and the high-level signal inputted from the first clock signal terminal CLK1 allows the sixth transistor M6 to be turned off. The signal inputted from the second clock signal terminal CLK2 changes from the high level to the low level, and the voltage level at the gate electrode of the fourth transistor M4 is further pulled down due to the effect of coupling capacitor (i.e., the second capacitor C2) between the gate electrode and the first electrode of the fourth transistor M4. The fourth and first transistors M4 and M1 maintain on, and the high-level signal of the first level terminal VGH is transmitted to the first end of the first capacitor C1 via the first transistor M1 so as to ensure the second and third transistors M2 and M3 to be turned off. The low-level signal of the second clock signal terminal CLK2 is transmitted to the output terminal Gate via the fourth transistor M4, such that the low-level signal is outputted through the output terminal Gate.

In the fifth stage T5, a high-level signal is inputted from the first input terminal, a low-level signal is inputted from the second input terminal, a low-level signal is inputted from the first clock signal terminal, and a high-level signal is inputted from the second clock signal terminal, such that the pulling-up node is driven to a high level by the pulling-up unit, the pulling-down node is driven to a low level by the pulling-down unit, and the output unit outputs a high-level signal from the output terminal of the shift register.

In this embodiment, in the fifth stage T5, the signals inputted from the first input terminal STVG and the second clock signal terminal CLK2 are at a high level, and the signals inputted from the second input terminal NET5 and the first clock signal terminal CLK1 are at a low level. The fifth and sixth transistors M5 and M6 are turned on under control of the second input terminal NET5 and the first clock terminal CLK1, and the high-level signal inputted from the first input terminal STVG is transmitted to the first end of the second capacitor C2 via the sixth transistor M6 so as to ensure the first and fourth transistors M1 and M4 to be turned off. The low-level signal of the second level terminal VGL is transmitted to the first end of the first capacitor C1 via the fifth transistor M5, the second and third transistors M2 and M3 are turned on, and the high-level signal of the first level terminal VGH is transmitted to the first end of the second capacitor C2 via the second transistor M2 so as to ensure the first and fourth transistors M1 and M4 to be turned off. The high-level signal of the first level terminal VGH is transmitted to the output terminal Gate via the third transistor M3, such that the high-level signal is outputted through the output terminal Gate.

In the sixth stage T6, a high-level signal is inputted from the first input terminal, a low-level signal is inputted from the second input terminal, a high-level signal from the first clock signal terminal, and a low-level signal is inputted from the second clock signal terminal, such that the pulling-up node is driven to a high level by the pulling-up unit, the pulling-down node is driven to a low level by the pulling-down unit, and the output unit outputs a high-level signal from the output terminal of the shift register.

In this embodiment, in the sixth stage T6, the signals inputted from the first input terminal STVG and the first clock signal terminal CLK1 are at a high level, and the signals inputted from the second input terminal NET5 and the second clock signal terminal CLK2 are at a low level. The fifth transistor M5 is turned on by the low level of the second input terminal NET5, the low-level signal of the second level terminal VGL is transmitted to the first end of the first capacitor C1 via the fifth transistor M5 so as to ensure the second and third transistors M2 and M3 to be turned on, and the high-level signal of the first level terminal VGH is transmitted to the first end of the second capacitor C2 via the second transistor M2 so as to ensure stable high level at the gate electrodes of the first and fourth transistors M1 and M4. The on state of the third transistor M3 can ensure the high-level signal of the first level terminal VGH to be transmitted to the output terminal Gate, such that the high-level signal is outputted through the output terminal Gate.

After the step for the sixth stage, the steps for the fifth and sixth stages may be repeatedly performed a first predetermined times until the signal inputted from the second input terminal NET5 changes from the low level to the high level. In such a case that the signal inputted from the second input terminal NET5 changes from the low level to the high level after the sixth stage T6, the method for driving a shift register may further include the following seventh and eighth stages T7 and T8.

In the seventh stage T7, a high-level signal is inputted from the first input terminal, a high-level signal is inputted from the second input terminal, a low-level signal is inputted from the first clock signal terminal, and a high-level signal is inputted from the second clock signal terminal, such that the pulling-up node is driven to a high level by the pulling-up unit, the pulling-down node is driven to a low level by the pulling-down unit, and the output unit outputs a high-level signal from the output terminal of the shift register.

In this embodiment, in the seventh stage T7, the signals inputted from the first input terminal STVG, the second input terminal NET5 and the second clock signal terminal CLK2 are at a high level, and the signal inputted from the first clock signal terminal CLK1 is at a low level. The sixth transistor M6 is turned on wider control of the first clock signal terminal CLK1, and the high-level signal of the first input terminal STVG is transmitted to the first end of the second capacitor C2 via the sixth transistor M6 so as to ensure the first and fourth transistors M1 and M4 to be turned off. At this time, the low level in the previous stage is maintained at the first end of the first capacitor C1, the second and third transistors M2 and M3 are turned on, and the high-level signal of the first level terminal VGH is transmitted to the first end of the second capacitor C2 via the second transistor M2, such that the first and fourth transistors M1 and M4 remain off. The high-level signal of the first level terminal VGH is transmitted to the output terminal Gate via the third transistor M3, such that the high-level signal is outputted through the output terminal Gate.

In the eighth stage T8, a high-level signal is inputted from the first input terminal, a high-level signal is inputted from the second input terminal, a high-level signal is inputted from the first clock signal terminal, and a low-level signal is inputted from the second clock signal terminal, such that the pulling-up node is driven to a high level by the pulling-up unit, the pulling-down node is driven to a low level by the pulling-down unit, and the output unit outputs a high-level signal from the output terminal of the shift register.

In this embodiment, in the eighth stage T8, the signals inputted from the first input terminal STVG, the second input terminal NET5 and the first clock signal terminal CLK1 are at a high level, and the signal inputted from the second clock signal terminal CLK2 is at a low level. At this time, the first end of the second capacitor C2 maintains a high level, such that the first and fourth transistors M1 and M4 are turned off. The first end of the first capacitor C1 maintains a low level, such that the second and third transistors M2 and M3 are turned on, and the high-level signal of the first level terminal VGH is transmitted to the output terminal Gate via the third transistor M3, such that the high-level signal is outputted through the output terminal Gate.

After the step for the eighth stage, a process of sequentially performing the steps for the fifth, sixth, seventh and eighth stages once for each stage is repeatedly performed a second predetermined times.

It needs to be set forth that the signal inputted from the second input terminal NET5 may be provided as a signal of an intermediate node of the light-emitting control shift register in the prior art. In this way, the shift register provided by the first embodiment may serve as a scan control shift register which may be integrated with the light-emitting control shift register in the prior art, and the scan control shift register and the light-emitting control shift register in the prior art share a set of clock signals, which reduces the number of clock signals, thereby improving driving efficiency and reducing product cost. However, the signal inputted from the second input terminal NET5 is not limited thereto, and it may be any signal satisfying the requirements of the above first to eighth stages.

In the method for driving a shift register provided by this embodiment, the shift register includes the pulling-up unit, the pulling-down unit and the output unit, the pulling-up unit being connected to the first input terminal, the first clock signal terminal, the first level terminal, the pulling-down node and the pulling-up node, respectively, the pulling-down unit being connected to the second input terminal, the second level terminal, the first level terminal, the pulling-up node and the pulling-down node, respectively, and the output unit being connected to the first level terminal, the second clock signal terminal, the output terminal, the pulling-down node and the pulling-up node. The method provided by this embodiment provides the output signal through the output terminal of the shift register according to the signals inputted from the first input terminal, the second input terminal, the first level terminal, the second level terminal, the first clock signal terminal and the second clock signal terminal of the shift register, and the number of clock signals is decreased, thereby improving driving efficiency and reducing product cost.

Third Embodiment

This embodiment of the present invention provides a driving circuit including the shift register provided by the first embodiment, the details of which may refer to the description of the first embodiment and are omitted herein.

In the driving circuit provided by this embodiment, the shift register includes the pulling-up unit, the pulling-down unit and the output unit, the pulling-up unit being connected to the first input terminal, the first clock signal terminal, the first level terminal, the pulling-down node and the pulling-up node, respectively, the pulling-down unit being connected to the second input terminal, the second level terminal, the first level terminal, the pulling-up node and the pulling-down node, respectively, and the output unit being connected to the first level terminal, the second clock signal terminal, the output terminal, the pulling-down node and the pulling-up node. In the driving circuit provided by this embodiment, the shift register provides the output signal through the output terminal according to the signals inputted from the first input terminal, the second input terminal, the first level terminal, the second level terminal, the first clock signal terminal and the second clock signal terminal, and the number of clock signals is decreased, thereby improving driving efficiency and reducing product cost.

Fourth Embodiment

This embodiment of the present invention provides a display device including the driving circuit provided by the third embodiment, the details of which may refer to the description of the above embodiments and are omitted herein.

In the display device provided by this embodiment, the shift register includes the pulling-up unit, the pulling-down unit and the output unit, the pulling-up unit being connected to the first input terminal, the first clock signal terminal, the first level terminal, the pulling-down node and the pulling-up node, respectively, the pulling-down unit being connected to the second input terminal, the second level terminal, the first level terminal, the pulling-up node and the pulling-down node, respectively, and the output unit being connected to the first level terminal, the second clock signal terminal, the output terminal, the pulling-down node and the pulling-up node. In the display device provided by this embodiment, the shift register provides the output signal through the output terminal according to the signals inputted from the first input terminal, the second input terminal, the first level terminal, the second level terminal, the first clock signal terminal and the second clock signal terminal, and the number of clock signals is decreased, thereby improving driving efficiency and reducing product cost.

It can be understood that the foregoing embodiments are merely exemplary embodiments used for describing the principle of the present invention, but the present invention is not limited thereto. Those of ordinary skill in the art may make various variations and improvements without departing from the spirit and essence of the present invention, and these variations and improvements shall fall into the protection scope of the present invention.

What is claimed is:

1. A shift register, comprising:
a pulling-up unit, which is connected to a first input terminal, a first clock signal terminal, a first level terminal, a pulling-down node and a pulling-up node, respectively, and is configured to control a voltage level at the pulling-up node according to a voltage level at the pulling-down node and signals inputted from the first input terminal, the first level terminal and the first clock signal terminal;
a pulling-down unit, which is connected to a second input terminal, a second level terminal, the first level terminal, the pulling-down node and the pulling-up node, respectively, and is configured to control the voltage level at the pulling-down node according to the voltage level at the pulling-up node and signals inputted from the second input terminal, the second level terminal and the first level terminal; and
an output unit, which is connected to the first level terminal, a second clock signal terminal, an output terminal, the pulling-down node and the pulling-up node, respectively, and is configured to provide an output signal through the output terminal according to the voltage levels of the pulling-down node and the pulling-up node and signals inputted from the first level terminal and the second clock signal terminal.

2. The shift register according to claim 1, wherein the output unit includes:
  a first output module, which is connected to the first level terminal, the output terminal and the pulling-down node, respectively, and is configured to control the output signal outputted from the output terminal according to the signal inputted from the first level terminal and the voltage level at the pulling-up node; and
  a second output module, which is connected to the second clock signal terminal, the output terminal and the pulling-up node, respectively, and is configured to control the output signal outputted from the output terminal according to the signal inputted from the second clock signal terminal and the voltage level at the pulling-up node.

3. The shift register according to claim 1, wherein the pulling-up unit includes a first pulling-up transistor and a second pulling-up transistor;
  a gate electrode of the first pulling-up transistor is connected to the pulling-down node, a first electrode of the first pulling-up transistor is connected to the first level terminal, and a second electrode of the first pulling-up transistor is connected to the pulling-up node; and
  a gate electrode of the second pulling-up transistor is connected to the first clock signal terminal, a first electrode of the second pulling-up transistor is connected to the first input terminal, and a second electrode of the second pulling-up transistor is connected to the pulling-up node.

4. The shift register according to claim 1, wherein the pulling-down unit includes a first pulling-down transistor and a second pulling-down transistor;
  a gate electrode of the first pulling-down transistor is connected to the pulling-up node, a first electrode of the first pulling-down transistor is connected to the first level terminal, and a second electrode of the first pulling-down transistor is connected to the pulling-down node; and
  a gate electrode of the second pulling-down transistor is connected to the second input terminal, a first electrode of the second pulling-down transistor is connected to the second level terminal, and a second electrode of the second pulling-down transistor is connected to the pulling-down node.

5. The shift register according to claim 2, wherein the first output module includes an output transistor and a first capacitor;
  a gate electrode of the output transistor is connected to the pulling-down node, a first electrode of the output transistor is connected to the first level terminal, and a second electrode of the output transistor is connected to the output terminal; and
  a first end of the first capacitor is connected to the pulling-down node, and a second end of the first capacitor is connected to the first level terminal.

6. The shift register according to claim 2, wherein the second output module includes an output transistor and a capacitor;
  a gate electrode of the output transistor is connected to the pulling-up node, a first electrode of the output transistor is connected to the output terminal, and a second electrode of the output transistor is connected to the second clock signal terminal; and
  a first end of the capacitor is connected to the pulling-up node, and a second end of the capacitor is connected to the output terminal.

7. A method for driving the shift register according to claim 1, the first level terminal providing a high level, the second level terminal providing a low level, the method comprising steps of:
  in a first stage, inputting a high-level signal from the first input terminal, inputting a low-level signal from the second input terminal, inputting a low-level signal from the first clock signal terminal, and inputting a high-level signal from the second clock signal terminal, such that the pulling-up node is driven to a high level by the pulling-up unit, the pulling-down node is driven to a low level by the pulling-down unit, and the output unit outputs a high-level signal from the output terminal of the shift register;
  in a second stage, inputting a high-level signal from the first input terminal, inputting a low-level signal from the second input terminal, inputting a high-level signal from the first clock signal terminal, and inputting a low-level signal from the second clock signal terminal, such that the pulling-up node is driven to a high level by the pulling-up unit, the pulling-down node is driven to a low level by the pulling-down unit, and the output unit outputs a high-level signal from the output terminal of the shift register;
  in a third stage, inputting a low-level signal from the first input terminal, inputting a high-level signal from the second input terminal, inputting a low-level signal from the first clock signal terminal, and inputting a high-level signal from the second clock signal terminal, such that the pulling-up node is driven to a low level by the pulling-up unit, the pulling-down node is driven to a high level by the pulling-down unit, and the output unit outputs a high-level signal from the output terminal of the shift register;
  in a fourth stage, inputting a high-level signal from the first input terminal, inputting a high-level signal from the second input terminal, inputting a high-level signal from the first clock signal terminal, and inputting a low-level signal from the second clock signal terminal, such that the pulling-up node is driven to a low level by the pulling-up unit, the pulling-down node is driven to a high level by the pulling-down unit, and the output unit outputs a low-level signal from the output terminal of the shift register;
  in a fifth stage, inputting a high-level signal from the first input terminal, inputting a low-level signal from the second input terminal, inputting a low-level signal from the first clock signal terminal, and inputting a high-level signal from the second clock signal terminal, such that the pulling-up node is driven to a high level by the pulling-up unit, the pulling-down node is driven to a low level by the pulling-down unit, and the output unit outputs a high-level signal from the output terminal of the shift register; and
  in a sixth stage, inputting a high-level signal from the first input terminal, inputting a low-level signal from the second input terminal, inputting a high-level signal from the first clock signal terminal, and inputting a low-level signal from the second clock signal terminal, such that the pulling-up node is driven to a high level by the pulling-up unit, the pulling-down node is driven to a low level by the pulling-down unit, and the output unit outputs a high-level signal from the output terminal of the shift register.

8. The method according to claim 7, further comprising:
  in a seventh stage, inputting a high-level signal from the first input terminal, inputting a high-level signal from the second input terminal, inputting a low-level signal from the first clock signal terminal, and inputting a high-level signal from the second clock signal terminal, such that the pulling-up node is driven to a high level by the pulling-up unit, the pulling-down node is driven to a low level by the pulling-down unit, and the output unit outputs a high-level signal from the output terminal of the shift register; and in an eighth stage, inputting a high-level signal from the first input terminal, inputting a high-level signal from the second input terminal, inputting a high-level signal from the first clock signal terminal, and inputting a low-level signal from the second clock signal terminal, such that the pulling-up node is driven to a high level by the pulling-up unit, the pulling-down node is driven to a low level by the pulling-down unit, and the output unit outputs a high-level signal from the output terminal of the shift register, wherein the seventh stage follows the sixth stage, and starts at a time when the signal inputted from the second input terminal changes from the low level to the high level.

9. The method according to claim 8, further comprising:

repeatedly performing, a first predetermined times, the steps for the fifth and sixth stages, before performing the step for the seventh stage and after sequentially performing the steps for the fourth, fifth and sixth stages.

10. The method according to claim 9, further comprising:

after performing the step for the eighth stage for the first time, repeatedly performing, a second predetermined times, a process of sequentially performing the steps for the fifth, sixth, seventh and eighth stages once for each stage.

11. A driving circuit, comprising the shift register according to claim 1.

12. A display device, comprising the driving circuit according to claim 11.

* * * * *